United States Patent
Nilson et al.

(10) Patent No.: US 7,948,276 B2
(45) Date of Patent: May 24, 2011

(54) GATE DRIVER CIRCUIT, SWITCH ASSEMBLY AND SWITCH SYSTEM

(75) Inventors: Thord Agne Gustaf Nilson, Tyreso (SE); Ulf Bengt Ingemar Karlsson, Bagarmossen (SE)

(73) Assignee: Kollmorgen AB, Stockholm (SE)

( * ) Notice: Subject to any disclaimer, the term of this patent is extended or adjusted under 35 U.S.C. 154(b) by 0 days.

(21) Appl. No.: 12/545,156

(22) Filed: Aug. 21, 2009

(65) Prior Publication Data

US 2010/0148830 A1    Jun. 17, 2010

(30) Foreign Application Priority Data

Dec. 15, 2008    (EP) .................................... 08171636

(51) Int. Cl.
*H03B 1/00* (2006.01)

(52) U.S. Cl. ........ 327/108; 327/112; 327/427; 327/478; 327/494; 326/21; 326/82

(58) Field of Classification Search .............. 326/21–24, 326/26, 27, 82–83, 87; 327/108–112, 427–434, 327/478–481, 494–497
See application file for complete search history.

(56) References Cited

U.S. PATENT DOCUMENTS

| 6,097,582 | A |  | 8/2000 | John et al. |
| 6,459,324 | B1 | * | 10/2002 | Neacsu et al. ................. 327/379 |
| 7,242,238 | B2 | * | 7/2007 | Higashi ......................... 327/427 |
| 7,538,587 | B2 | * | 5/2009 | Iwagami et al. .............. 327/108 |
| 2002/0070772 | A1 |  | 6/2002 | Neacsu et al. |
| 2004/0041201 | A1 | * | 3/2004 | Sugiyama et al. ............ 257/316 |
| 2006/0006922 | A1 | * | 1/2006 | Sander ......................... 327/434 |
| 2007/0200613 | A1 |  | 8/2007 | Ishikawa et al. |

FOREIGN PATENT DOCUMENTS

| DE | 19717715 C2 | 10/2001 |
| EP | 1184984 A1 | 3/2002 |
| EP | 1536564 A1 | 6/2005 |
| GB | 2417149 A | 2/2006 |
| GB | 2417625 A | 3/2006 |

OTHER PUBLICATIONS

European Search Report dated May 11, 2009.
D.V.M.M. Krishna and Vivek Agarwal, Active Gate Control of Series Connected IGBT's Using Positive Current Feedback Technique, IEEE Transactions on Circuits and Systems—II: Express Briefs, vol. 52, No. 5, May 2005, pp. 261-265.

(Continued)

*Primary Examiner* — Lincoln Donovan
*Assistant Examiner* — Shikha Goyal
(74) *Attorney, Agent, or Firm* — Holland & Hart LLP

(57) ABSTRACT

It is presented a gate driver circuit for driving an electric switch, the switch being arranged to control a main current using a gate signal. The gate driver circuit comprises: a non-linear capacitor means having a lower capacitance when an applied voltage is under a threshold voltage and a higher capacitance when an applied voltage is over the threshold voltage, wherein the non-linear capacitor is arranged to be connected between a high voltage connection point of the switch and a connection point for the gate signal; a current change rate sensor, the current change rate sensor being configured to detect changes in a main current of the electric switch and to control a gate signal of the electric switch depending on the current change; a gate buffer; and at least one current source, arranged to drive the gate buffer. The current change rate sensor is connected to control the current source to thereby control the gate signal of the electric switch.

16 Claims, 6 Drawing Sheets

OTHER PUBLICATIONS

N.P. Van Der Duijn Schouten et al., A Study of Inverter Operation in Small Induction Motor Drives, Cambridge University Department of Engineering, UK, Power Electronics, Machines and Drives, Apr. 16-18, 2002, pp. 353-358.

Fasching Martin, Effects of Stray Inductance on Switching Transients of an IGBT Propulsion Inverter and Resulting Gate Control Strategies, Siemens AG Germany (Erlangen), pp. 467-472.

* cited by examiner

GATE DRIVER CIRCUIT, SWITCH ASSEMBLY AND SWITCH SYSTEM

FIELD OF INVENTION

The present invention relates generally to driving electric switches, and more particularly to driving electric switches for power conversion use.

BACKGROUND

Power switches, such as insulated gate bipolar transistors (IGBTs) can be used to control electric power transfer to an appliance such as a motor. Often such switching is used to effect pulse width modulation (PWM) to control frequency and/or current transferred to the appliance.

Stray inductance in emitter and collector terminal connections of such-switches are often relatively large due to the mechanical design. This typically leads to overshoots of the voltage across the switch.

One solution to this problem is to select switches which have ratings that are sufficient to withstand the overvoltages resulting from such overshoots. However, such over-dimensioning of components is unnecessarily expensive and may require more physical volume.

Other solutions include limiting the switching speed or times, and thereby the overshoots, e.g. by using a relatively large gate resistor in series with a voltage stiff driver stage buffer. The gate charge current of the switch is then limited. The drawback with this solution is that if low overshoots in voltage and current (the current overshoot being a result of diode recovery current) shall be accomplished the switching times need to be slowed down considerably more than optimum.

US2002-0070772 presents an active resistance controlled to modify a drive signal provided to a gated device such as an insulated gate bipolar transistor (IGBT). The active resistance is between an input lead that receives an input drive signal, such as from a conventional gate driver IC, and an output lead at which an output drive signal is provided to the device's gate. The active resistance is controlled in response to a feedback signal that includes information about the output drive signal, so that the output drive signal is a modified version of the input drive signal. To reduce di/dt and hence control EMI emission, the output drive signal can include turn-on and turn-off transitions where the input drive signal includes steps. Such a solution is complicated and can be liable to ill-effects if controlled incorrectly.

Hence, there is a need for a robust solution of how to reduce voltage overshoots when driving power switches.

SUMMARY

An object of the present invention is thus to reduce voltage overshoots when switching electric power components.

According to a first aspect of the invention, it is presented a gate driver circuit for driving an electric switch, the switch being arranged to control a main current using a gate signal. The gate driver circuit comprises: a non-linear capacitor means having a lower capacitance when an applied voltage is under a threshold voltage and a higher capacitance when an applied voltage is over the threshold voltage, wherein the non-linear capacitor is arranged to be connected between a high voltage connection point of the switch and a connection point for the gate signal; a current change rate sensor, the current change rate sensor being configured to detect changes in a main current of the electric switch and to control a gate signal of the electric switch depending on the current change; a gate buffer; and at least one current source, arranged to drive the gate buffer. The current change rate sensor is connected to control the current source to thereby control the gate signal of the electric switch. The main current is to be construed as the main current through the switch.

Using the non-linear capacitor and the current change rate sensor according to the invention, overshoots are reduced. The feedback regulated, gate charge current control makes it possible to achieve higher switching speed while still maintaining the above mentioned low overshoots.

The at least one current source may comprise two current sources arranged on either side of the buffer.

The current change rate sensor may be configured to reduce a discharging of a gate of the switch when a large negative current change rate of the main current is detected.

The current change rate sensor may be configured to reduce a charging of a gate of the switch when a large positive current change rate of the main current is detected.

The current change rate sensor may be realized by a device for measuring a voltage over stray inductance.

The non-linear capacitor means may be implemented using a ceramic capacitor, such as an X7R capacitor, in series with an NPO/C0G capacitor with a biased mid-point.

The non-linear capacitor means may be implemented using two linear capacitors in series with a zener diode parallel to one of the linear capacitors. The zener diode may be implemented as two or more zener diodes connected in series. The zener diodes could be replaced by any suitable transient voltage suppressor.

The gate driver circuit may further comprise a gate buffer; and two current sources arranged to drive the gate buffer; wherein the current change rate sensor is connected to control the current sources to thereby control the gate signal of the electric switch.

The gate driver circuit may further comprise a first resistor connected to the buffer and the non-linear capacitor means in one end and the first resistor arranged to be connected to the connection point for the gate signal in the other end.

The gate driver circuit may further comprise a second resistor connected in series with the non-linear capacitor means.

The gate driver circuit may be arranged to drive an insulated-gate bipolar transistor.

A second aspect of the invention is a switch assembly comprising a gate driver circuit according to the first aspect and an electric switch, wherein the gate driver circuit is arranged to drive the electric switch.

The switch may be an insulated-gate bipolar transistor.

A third aspect is a switch system comprising two switch assemblies according to second aspect, for each phase.

The switch system may comprise six switch assemblies for use with a three phase appliance.

For each phase: the two switch assemblies may be connected to a higher DC voltage and a lower DC voltage, respectively, and there may be a motor connection point between the two switch assemblies.

The switch system may further comprise a controller connected to all gate driver circuits.

It is to be noted that any feature of the first, second and third aspects may, where appropriate, be applied to any other aspect.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF DRAWINGS

The invention is now described, by way of example, with reference to the accompanying drawings, in which.

DETAILED DESCRIPTION OF PREFERRED EMBODIMENTS

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
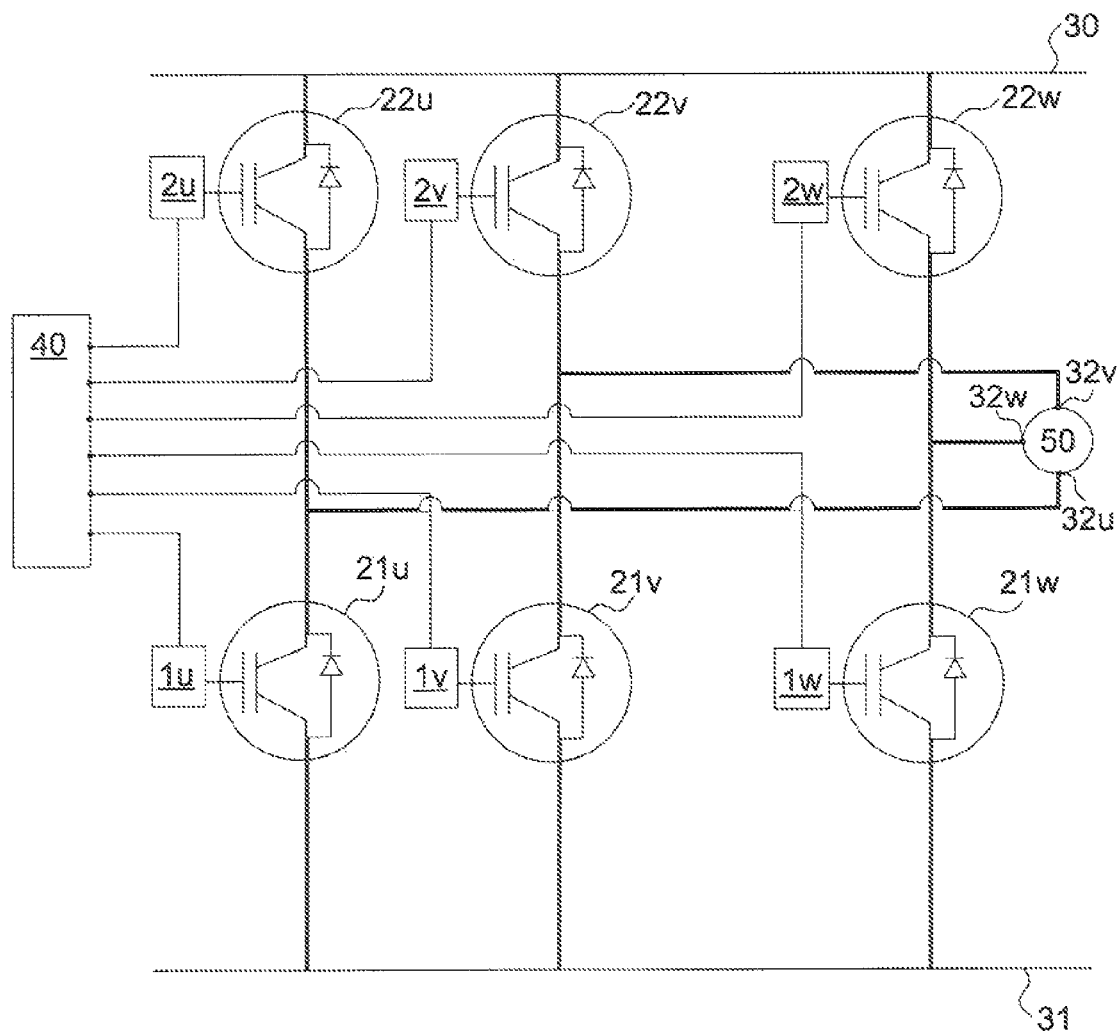
FIG. 1 is a schematic diagram of an environment where a transistor driver according to an embodiment of the present invention can be applied.

FIG. 1 is a schematic diagram of an environment where a transistor driver according to an embodiment of the present invention can be applied.

A three-phase motor 50 is powered through three AC (Alternating Current) inputs 32$u$-$w$. To allow control of frequency and power supplied to the motor 50, a bridge leg inverter system is used where the inputs 32$u$-$w$ are switched between a positive DC voltage 30 and a negative DC voltage 31. The difference in voltage between the positive and the negative DC voltages 30, 31 typically ranges between 300 and 900 volts. The positive and negative DC voltages can be symmetrical or asymmetrical about zero. The DC voltages 30 and 31 can in turn be created from a rectified AC source or from a DC source. The switching is performed in switches 21$u$ and 22$u$ for a u-phase, in switches 21$v$ and 22$v$ for a v-phase and in switches 21$w$ and 22$w$ for a w-phase. The switches 21$u$-$w$, 22$u$-$w$ can be insulated-gate bipolar transistors (IGBT) or any other suitable switch.

Each switch 21$u$-$w$, 22$u$-$w$ has a corresponding gate drive circuit 1$u$-$w$, 2$u$-$w$, respectively. Each gate drive circuit 1$u$-$w$, 2$u$-$w$ is controlled from an output (typically a digital output) of a controller 40 to effect pulse width modulation (PWM) as desired from the controller 40. The controller 40 can thus control the frequency and power supplied to the motor 50.

Figure 2:
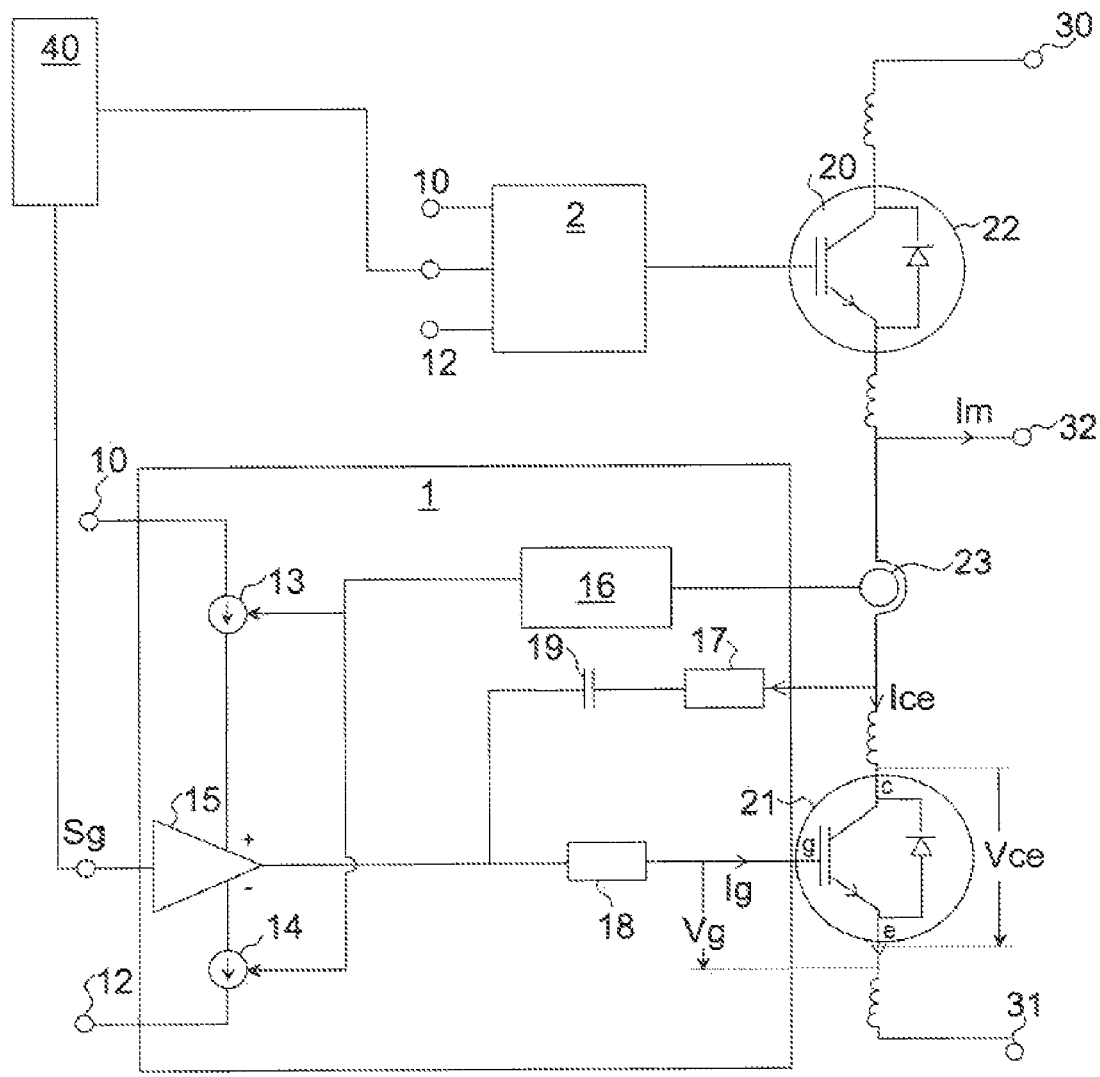
FIG. 2 illustrates one leg of the system of FIG. 1, and one gate driver circuit in more detail.

FIG. 2 illustrates one leg of the system of FIG. 1, and one gate driver circuit in particular. The leg can be any of the three legs of FIG. 1 since all three legs have the same configuration in this regard.

There is an upper switch 22 and a lower switch 21, connected to a positive DC voltage 30 and a negative DC voltage 31, respectively. The upper switch 22 is driven by an upper gate driver circuit 2 and the lower switch 21 is driven by a lower gate driver circuit 1. As is known in the art, the switches control a main current passing through a collector and emitter of the switches 21, 22. The two gate driver circuits 1, 2 have the same configuration but for clarity only the lower gate driver circuit is shown in detail in FIG. 2. The controller 40 sends low voltage control signals to the two gate driver circuits 1, 2 to control the switching of the switches 21, 22. Each gate driver circuit 1,2 is connected to a positive DC power supply 10 and a negative DC power supply 12. The positive DC power supply 10 can, for example, have a voltage of 5 to 30 volts, e.g. 22 volts. The negative DC power supply 12 can, for example, have a voltage of −5 to −30 volts, e.g. −7 volts. The control signal from the controller can for example vary between −30 to +30 volts, e.g. −5 to +15 volts. It is to be noted that the parameters specified above are only examples and any voltage suitable for the particular case can be selected.

Now the details of the lower gate driver circuit 1 will be discussed. The lower gate driver circuit 1 comprises a buffer 15 which is connected to the controller 40, to react to a signal from the controller. The buffer 15 is driven by two current sources 13, 14. While two current sources are presented in this embodiment, it is also possible to use only one current source. The output of the buffer 15 is connected, via a resistor 18 to the a connection point for a gate signal of the lower switch 21. The resistor 18 can optionally be integrated in the switch 21.

Furthermore, a current sensor 23 is connected to a current change rate (di/dt) sensor 16, which in turn is connected to the current sources 13, 14 for control. In other words, current changes affect the current sources 13, 14 which then affects the signal out of the buffer 15 which drives the gate. The dynamics of this will be explained in more detail below, for example when reducing overshoots on switching. In this embodiment, the current of the current sources could then follow a formula of $I=I_{nom}+k*dI_{ce}/dt$, where $I_{nom}$ is a current not affected by the current derivative, k is a constant and $I_{ce}$ is a main current going through the collector and emitter of the switch 21. The current change rate (di/dt) sensor 16 can for example be implemented by measuring a voltage over an inductor connected to the main current. The inductor can be a specific component or a stray inductance.

Figure 6:
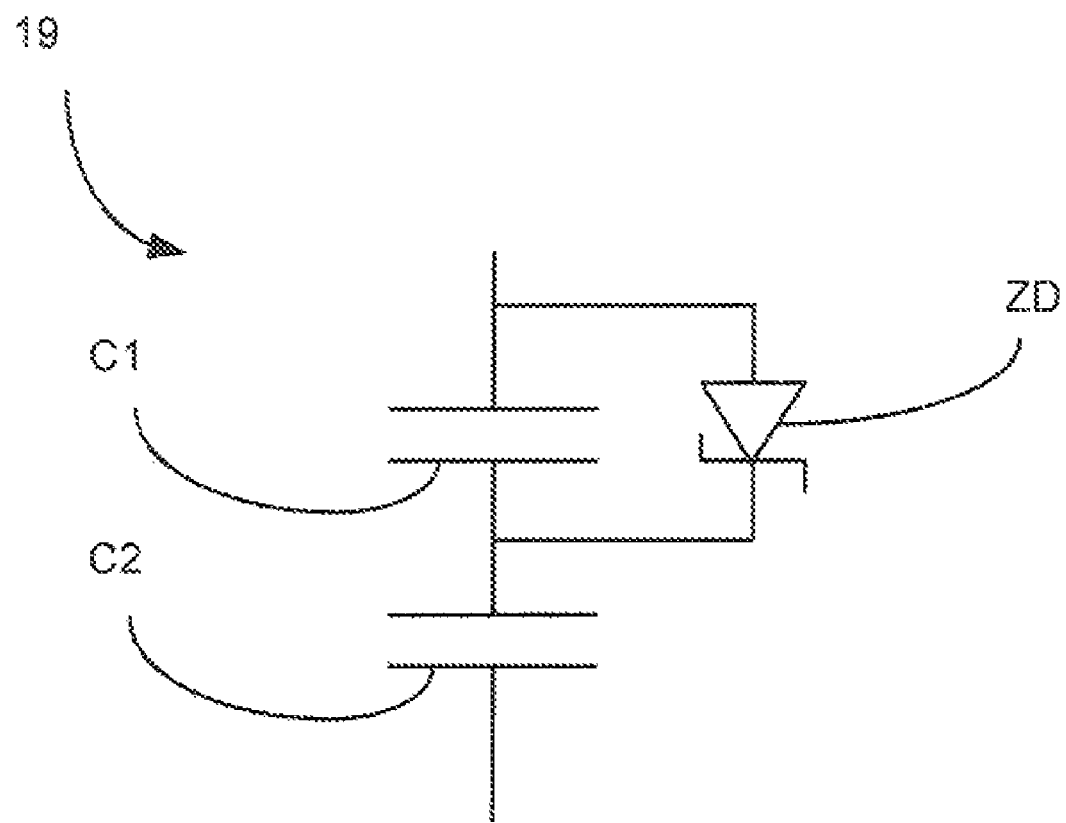
FIG. 6 is a schematic graph showing a non-linear capacitor comprising two linear capacitors in series with a zener diode parallel with one of the two linear capacitors.

Also, there is a connection from a high voltage connection point of the switch 21 via a resistor 17 and a non-linear capacitor 19 to the output of the buffer 15 affecting the gate of the switch 21 (via the resistor 18). The high voltage of the switch is typically the collector in case an IGBT switch is used and a drain in case a MOSFET switch is used. The non-linear capacitor 19 is such that the capacitance is relatively low when supplied with a voltage which is lower than a threshold voltage, and relatively high when supplied with a voltage which is higher than a threshold voltage. As an example, if the switch 21 normally has a voltage across it of about 850 volts when it is open, the threshold voltage of the non-linear capacitor can be about 600 volts, where the non-linear capacitor has a capacitance of about 300 pF (picofarads) for voltages significantly lower than 600 volts and about 1000 pF for voltages significantly higher than 600 volts. The numbers above are only an example and it is to be noted that the component parameters and voltages can be of any value suitable for the application. The threshold voltage of the non-linear capacitor, however, should be lower than the normal voltage across an open switch 21. As will be explained in more detail below, this then reduces overshoots when switching the switch 21. The non-linear capacitor 19 can for example be realised using a ceramic capacitor such as an X7R capacitor in series with an NPO/C0G capacitor with a suitable biased mid-point, or two linear capacitors C1, C2 in series with a zener diode ZD parallel to one of them as shown in FIG. 6.

Figure 3:
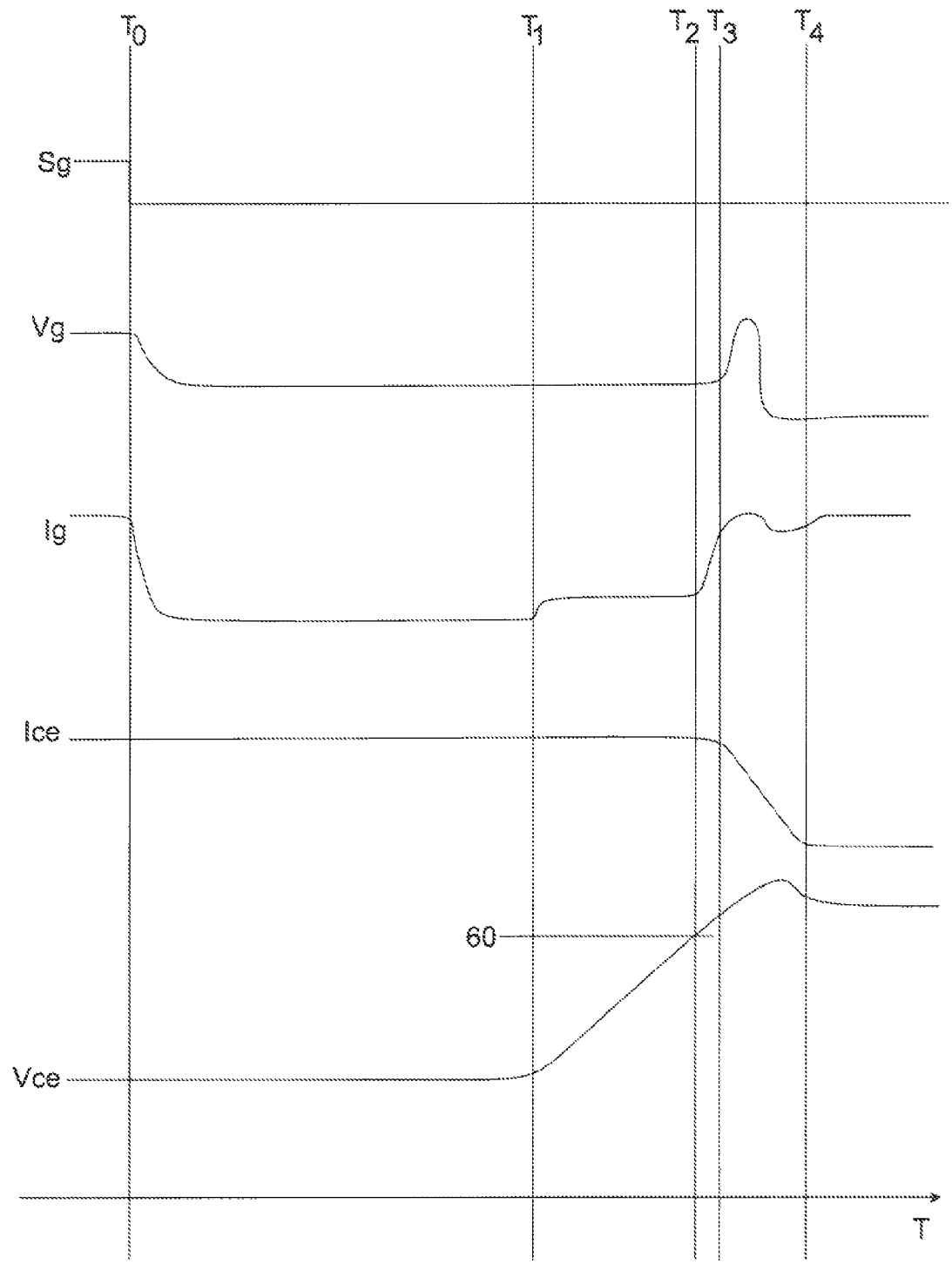
FIG. 3 is a schematic graph showing the dynamics of the gate driver circuit and the lower switch of FIG. 2 when the lower switch is changed from a closed to an open state.

FIG. 3 is a schematic graph showing the dynamics of the gate driver circuit 1 and the lower switch 21 of FIG. 2 when the lower switch 21 is changed from a closed to an open state. It is to be noted that only the time is common for all parameters in the graph. In other words, the relative vertical distance of the various parameters are not to be compared. For example, the absolute voltage measurements vary greatly from one voltage to another.

In the graph, $S_g$ denotes a gate control signal from the controller, $V_g$ denotes the voltage of the gate of the switch 21 relative the emitter of the switch, $I_g$ denotes the current going to the gate of the switch 21, $I_{ce}$ denotes the current passing through the collector and the emitter of the switch 21 and $V_{ce}$ denotes the voltage difference between the collector and the emitter of the switch 21.

The signal $S_g$ from the controller 40 goes from high to low at time $T_0$. This results in a $I_g$ going negative to discharge the gate of the switch 21. Consequently, the voltage $V_g$ of the switch 21 decreases.

At time $T_1$, the gate of switch 21 is sufficiently depleted for the switch to start the transition from the closed to the open state. Consequently, the voltage $V_{ce}$ across the collector and emitter of the switch starts to increase. The increase in $V_{ce}$ charges the capacitor 19, whereby the gate current $I_g$ increases slightly. Hence, this causes the magnitude of the gate current $I_g$ to decrease.

At time $T_2$, the voltage $V_{ce}$ across the switch 21 has increased to a threshold level 60. This means that the threshold level of the capacitor 19 has been reached whereby the capacitance of the capacitor 19 increases. Consequently, more of the negative gate current instead goes to the capacitor 19. Hence, the gate current $I_g$ increases even more. This reduces the overshoot of $V_{ce}$ significantly.

At time $T_3$, the current $I_{ce}$ starts to decrease. This is detected by the current change rate sensor 16, which controls the current generators 13, 14. Hence, the current generators 13,14 limit the maximum gate current $I_g$.

At time $T_4$, the current $I_{ce}$ has dropped to about zero. The voltage Vg is now stable at a low level and the gate current $I_g$ is on its way back to zero. The overshoot of $V_{ce}$ has now ended and $V_{ce}$ is stable.

Figure 4:
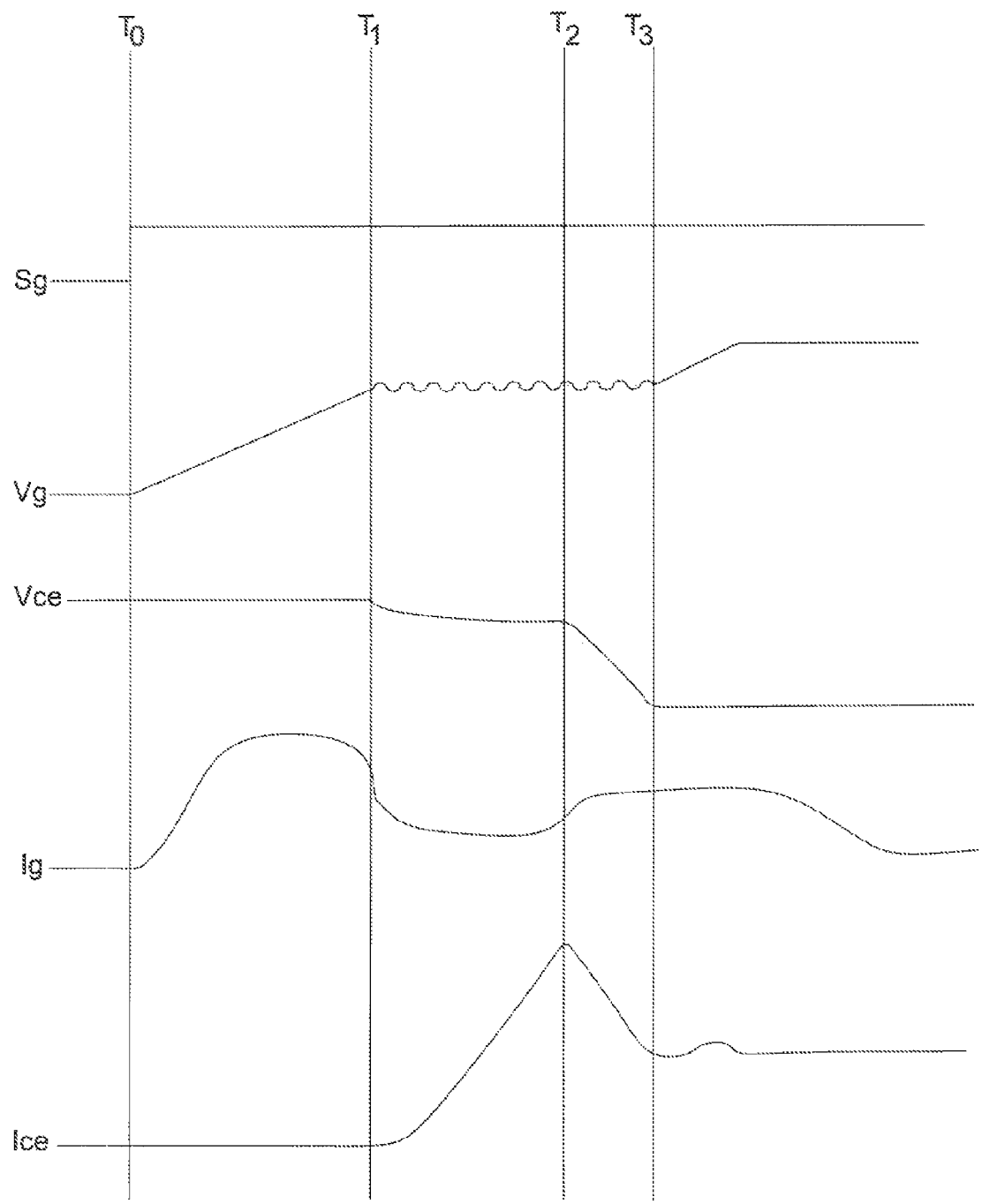
FIG. 4 is a schematic graph showing the dynamics of the gate driver circuit and the lower switch of FIG. 2 when the lower switch is changed from an open to, a closed state.

FIG. 4 is a schematic graph showing the dynamics of the gate driver circuit 1 and the lower switch 21 of FIG. 2 when the lower switch 21 is changed from a closed to an open state.

A gate signal $S_g$ from the controller 40 goes from low to high at time $T_0$. This results in an increase in $I_g$ to charge the gate of the switch 21. Consequently, the voltage $V_g$ of the switch 21 increases.

At time $T_1$, the gate of switch 21 is sufficiently charged for the current $I_{ce}$ to start to increase. The current change rate sensor 16 reacts to the increase in $I_{ce}$, controlling the current sources which thereby limits Ig, whereby $I_g$ decreases. Also, due to stray inductances, $V_{ce}$ drops somewhat at this time.

At time $T_2$, $I_{ce}$ peaks and starts to decrease. Due to the current change rate sensor 16, the current sources are controlled whereby the gate current $I_g$ is increased. The voltage $V_{ce}$ now starts to decrease.

At time $T_3$, the voltage $V_{ce}$ has dropped to a level for when the switch is fully open. The current $I_{ce}$ has now dropped to its end level and, the voltage $V_g$ now increases again. The current $I_g$ continues to flow until the gate is fully charged and drops off subsequently.

Figure 5:
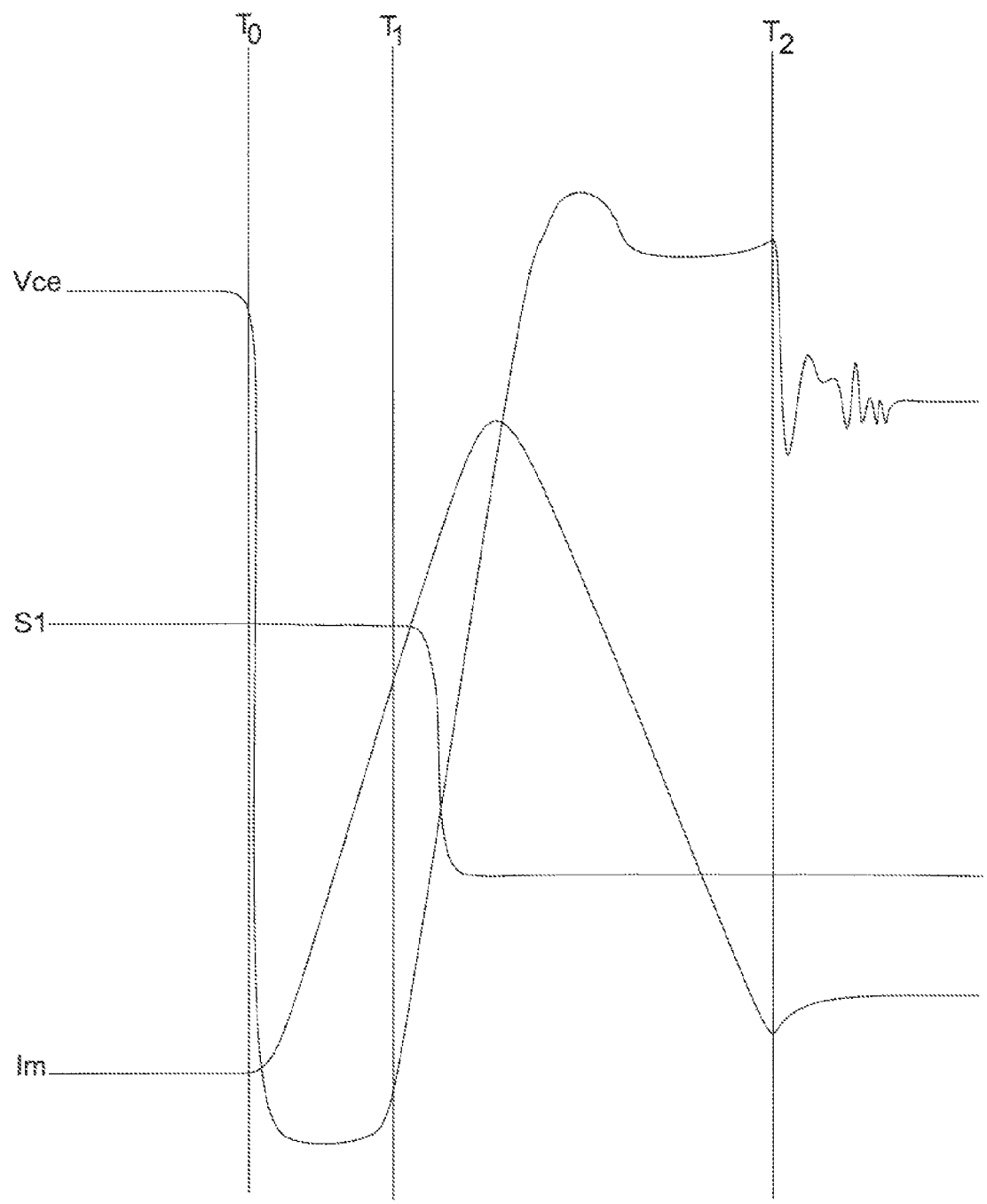
FIG. 5 is a schematic graph showing the dynamics of the gate driver circuit and the lower switch of FIG. 2 in a fault situation, e.g. a short circuit.

FIG. 5 is a schematic graph showing the dynamics of the gate driver circuit I and the lower switch 21 of FIG. 2 in a fault situation, e.g. a short circuit. $V_{ce}$ denotes the voltage difference between the collector and the emitter of the switch 21, $S_1$ denotes a signal from an over current protection device indicating an over current and $I_m$ denotes a current going to the motor at point 32 of FIG. 2.

At time $T_0$, the short circuit occurs, whereby the voltage $V_{ce}$ drops sharply. The current $I_m$ starts to increase, indicating a fault.

At the time T1, the switch goes out of saturation and the voltage $V_{ce}$ increases. Somewhat after time $T_1$, the signal $S_1$ drops as a response to the fault. This turns off the switch 21, whereby the voltage $V_{ce}$ increases further. This increase is limited by the current change rate (di/dt) control.

At T2, the current $I_m$ has returned to its lower value. $V_{ce}$ drops to a lower value.

The benefits with this gate drive circuit are lower voltage overshoots in collector-emitter voltage at switching and thereby lower EMC emission. This is especially applicable to high power drives where the stray inductances in the connections inside and to the switch/power semiconductor are substantial. By reducing the voltage overshoots, the power semiconductor can be used for higher DC voltages and thereby higher power can be converted for a drive/inverter with a given IGBT module voltage rating.

It is to be noted that while the embodiments above show the invention embodied in a bridge-leg topology, the present invention can be applied to any situation where overshoots are desired to be avoided.

The inventive concepts presented herein can be applied generally for power conversion devices, particularly in inverter for electric motor control, e.g. for hybrid or fully electrically powered vehicles.

The gate drive circuit described above protects the switch against excessive voltages or currents in all operating states. This particularly includes turning off the switch at a short-circuit situation when the collector current can become as high as ten times the normal operating current without voltage over-shoots reaching above the IGBT breakdown voltage.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A gate driver circuit for driving an electric switch, said switch being arranged to control a main current using a gate signal, said gate driver circuit comprising:
    a non-linear capacitor having a lower capacitance when an applied voltage is under a threshold voltage and a higher capacitance when an applied voltage is over said threshold voltage, wherein said non-linear capacitor is arranged to be connected between a high voltage connection point of said switch and a connection point for said gate signal;
    a current change rate sensor, said current change rate sensor being configured to detect changes in a main current of said electric switch and to control a gate signal of said electric switch in proportion to said current change;
    a gate buffer arranged to supply the gate signal to the switch; and
    at least one current source arranged to drive said gate buffer;

wherein said current change rate sensor is connected to control said current source to thereby control said gate signal of said electric switch.

2. The gate driver circuit according to claim 1, wherein said at least one current source comprises two current sources arranged on either side of said buffer.

3. The gate driver circuit according to claim 1, wherein said current change rate sensor is configured to reduce a discharging of a gate of said switch when a large negative current change rate of the main current is detected.

4. The gate driver circuit according to claim 1, wherein said current change rate sensor is configured to reduce a charging of a gate of said switch when a large positive current change rate of the main current is detected.

5. The gate driver circuit according to claim 1, wherein said current change rate sensor is realised by a device for measuring a voltage over a stray inductance.

6. The gate driver circuit according to claim 1 wherein said non-linear capacitor is implemented using a ceramic capacitor, such as an X7R capacitor, in series with an NPO/C0G capacitor with a biased mid-point.

7. The gate driver circuit according to claim 1, wherein said non-linear capacitor comprises two linear capacitors connected in series and a zener diode connected in parallel with one of said two linear capacitors.

8. The gate driver circuit according to claim 1, further comprising:

a first resistor connected to said buffer and said non-linear capacitor means in one end and said first resistor arranged to be connected to said connection point for said gate signal in the other end.

9. The gate driver circuit according to claim 1, further comprising:

a second resistor connected in series with said non-linear capacitor means.

10. The gate driver circuit according to claim 1, arranged to drive an insulated-gate bipolar transistor.

11. A switch assembly comprising a gate driver circuit according to claim 1 and an electric switch, wherein said gate driver circuit is arranged to drive said electric switch.

12. The switch assembly according to claim 11, wherein said switch is an insulated-gate bipolar transistor.

13. A switch system comprising two switch assemblies according to claim 11, for each phase.

14. The switch system according to claim 13, wherein for each phase:

the two switch assemblies are connected to a higher DC voltage and a lower DC voltage, respectively, and there is a motor connection point between said two switch assemblies.

15. The switch system according to claim 13, comprising six switch assemblies for use with a three phase appliance.

16. The switch system according to claim 13, further comprising a controller connected to all gate driver circuits.

* * * * *